United States Patent
White et al.

(10) Patent No.: US 9,129,907 B2
(45) Date of Patent: Sep. 8, 2015

(54) ONIUM-CONTAINING CMP COMPOSITIONS AND METHODS OF USE THEREOF

(75) Inventors: Michael L. White, Oswego, IL (US); Zhan Chen, Aurora, IL (US)

(73) Assignee: Cabot Microelectronics Corporation, Aurora, IL (US)

(*) Notice: Subject to any disclaimer, the term of this patent is extended or adjusted under 35 U.S.C. 154(b) by 1359 days.

(21) Appl. No.: 11/517,909

(22) Filed: Sep. 8, 2006

(65) Prior Publication Data

US 2008/0060278 A1    Mar. 13, 2008

(51) Int. Cl.
*H01L 21/3105* (2006.01)
*C09G 1/02* (2006.01)

(52) U.S. Cl.
CPC ............ *H01L 21/31053* (2013.01); *C09G 1/02* (2013.01)

(58) Field of Classification Search
CPC .............................. C09G 1/02; H01L 21/31053
USPC ................................ 51/308; 252/79.1; 451/28
See application file for complete search history.

(56) References Cited

U.S. PATENT DOCUMENTS

| | | | |
|---|---|---|---|
| 4,528,384 A * | 7/1985 | Schmidt et al. | 549/78 |
| 5,439,617 A * | 8/1995 | Akhavan-Tafti | 252/700 |
| 5,698,509 A * | 12/1997 | Nedonchelle | 510/424 |
| 5,858,813 A | 1/1999 | Scherber et al. | |
| 6,015,506 A | 1/2000 | Streinz et al. | |
| 7,018,560 B2 | 3/2006 | Liu et al. | |
| 2001/0005009 A1* | 6/2001 | Tsuchiya et al. | 252/79 |
| 2002/0042208 A1 | 4/2002 | Beitel et al. | |
| 2005/0009322 A1* | 1/2005 | Matsui et al. | 438/633 |
| 2005/0031789 A1 | 2/2005 | Liu et al. | |
| 2005/0076580 A1 | 4/2005 | Tamboli et al. | |
| 2006/0099814 A1* | 5/2006 | Carter et al. | 438/692 |

FOREIGN PATENT DOCUMENTS

| | | | | |
|---|---|---|---|---|
| JP | 2000-144109 | * | 5/2000 | C09K 3/14 |
| JP | 2001-332518 | * | 11/2001 | |

* cited by examiner

*Primary Examiner* — Shuangyi Abu Ali
(74) *Attorney, Agent, or Firm* — Thomas Omholt; Arlene Hornilla (57) ABSTRACT

The present invention provides a chemical-mechanical polishing (CMP) composition suitable for polishing semiconductor materials. The composition has a pH of about 5 or less and comprises colloidal silica, at least one onium compound selected from the group consisting of a phosphonium salt, a sulfonium salt, and a combination thereof, and an aqueous carrier therefor; A CMP method for polishing a surface of a semiconductor material utilizing the composition is also disclosed.

14 Claims, 4 Drawing Sheets

ONIUM-CONTAINING CMP COMPOSITIONS AND METHODS OF USE THEREOF

FIELD OF THE INVENTION

This invention relates to polishing compositions and methods for polishing a substrate using the same. More particularly, this invention relates to chemical-mechanical polishing compositions suitable for polishing semiconductor surfaces.

BACKGROUND OF THE INVENTION

A semiconductor wafer typically includes a substrate, such as silicon or gallium arsenide, on which a plurality of transistors have been formed. Transistors are chemically and physically connected to the substrate by patterning regions in the substrate and layers on the substrate. The transistors and layers are separated by interlevel dielectrics (ILDs), comprised primarily of some form of silicon oxide ($SiO_2$). The transistors are interconnected through the use of well known multilevel interconnects. Typical multilevel interconnects are comprised of stacked thin-films consisting of one or more of the following materials: titanium (Ti), titanium nitride (TiN), tantalum (Ta), aluminum-copper (Al—Cu), aluminum-silicon (Al—Si), copper (Cu), tungsten (W), doped polysilicon (poly-Si), and various combinations thereof. In addition, transistors or groups of transistors are isolated from one another, often through the use of trenches filled with an insulating material such as silicon dioxide, silicon nitride, and/or polysilicon.

Compositions and methods for chemical-mechanical polishing (CMP) of the surface of a semiconductor substrate are well known in the art. Polishing compositions (also known as polishing slurries, CMP slurries, and CMP compositions) for CMP of surfaces of semiconductor substrates (e.g., integrated circuits) typically contain an abrasive, various additive compounds, and the like.

In general, CMP involves the concurrent chemical and mechanical polishing of an overlying first layer to expose the surface of a non-planar second layer on which the first layer is formed. One such process is described in U.S. Pat. No. 4,789,648 to Beyer et al. Briefly, Beyer et al., discloses a CMP process using a polishing pad and a slurry to remove a first layer at a faster rate than a second layer until the surface of the overlying first layer of material becomes coplanar with the upper surface of the covered second layer. A more detailed explanation of chemical mechanical polishing is found in U.S. Pat. No. 4,671,851, No. 4,910,155 and No. 4,944,836.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents or other additives present in the CMP composition) and/or the mechanical activity of an abrasive suspended in the polishing composition. Typical abrasive materials include silicon dioxide, cerium oxide, aluminum oxide, zirconium oxide, and tin oxide.

U.S. Pat. No. 5,527,423 to Neville, et al., for example, describes a method for chemically-mechanically polishing a metal layer by contacting the surface of the metal layer with a polishing slurry comprising high purity fine metal oxide particles suspended in an aqueous medium. Alternatively, the abrasive material may be incorporated into the polishing pad. U.S. Pat. No. 5,489,233 to Cook et al. discloses the use of polishing pads having a surface texture or pattern, and U.S. Pat. No. 5,958,794 to Bruxvoort et al. discloses a fixed abrasive polishing pad.

Although many of the known CMP slurry compositions are suitable for limited purposes, the slurries described above tend to exhibit unacceptable polishing rates for various component materials such as silicon dioxide and corresponding selectivity for removal of materials used in wafer manufacture.

There is an ongoing need to develop new CMP compositions that exhibit useful removal rates for semiconductor materials such as silicon dioxide. The present invention provides such improved CMP compositions. These and other advantages of the invention, as well as additional inventive features, will be apparent from the description of the invention provided herein.

BRIEF SUMMARY OF THE INVENTION

The present invention provides a chemical-mechanical polishing (CMP) composition suitable for polishing semiconductor materials containing silicon dioxide. The composition has a pH of about 5 or less and comprises colloidal silica, at least one onium salt, which can be a phosphonium salt, a sulfonium salt, or a combination thereof, and an aqueous carrier (e.g., water). Preferably, the onium salt is a phosphonium salt.

In a preferred embodiment, the composition has a pH of about 5 or less and comprises about 0.05 to about 35 percent by weight of colloidal silica, about 0.04 to about 200 micromoles per gram (μmol/g) of at least one onium compound, and an aqueous carrier, such as water. Preferably, the onium compound is a phosphonium salt having the following formula:

wherein each $R^1$, $R^2$, $R^3$ and $R^4$ independently is a substituted or unsubstituted hydrocarbon radical selected from the group consisting of linear $C_1$-$C_{16}$ alkyl, branched $C_3$-$C_{16}$ alkyl, $C_6$-$C_{10}$ aryl, linear $C_1$-$C_{16}$ alkyl-substituted $C_6$-$C_{10}$ aryl, and branched $C_3$-$C_{16}$ alkyl-substituted $C_6$-$C_{10}$ aryl, wherein the hydrocarbon radical optionally can be substituted with one or more functional substituent selected from the group consisting of a hydroxyl substituent, a halo substituent, an ether substituent, an ester substituent, a carboxy substituent, and an amino substituent; and X— is the conjugate base of an acid. Alternatively, $R^1$ and $R^2$ together can form a saturated, unsaturated, or aromatic heterocyclic ring with the phosphorus, P. When the heterocyclic ring is aromatic, $R^4$ is absent.

Optionally, a sulfonium compound can be utilized in place of or in combination with the phosphonium compound.

The present invention also provides a chemical-mechanical polishing method for polishing a substrate. The method comprises abrading a surface of a substrate with a CMP composition of the invention. A preferred CMP method comprises the steps of contacting a surface of a semiconductor substrate with a polishing pad and an aqueous CMP composition of the invention, and causing relative motion between the polishing pad and the substrate while maintaining a portion of the CMP composition in contact with the surface between the pad and the substrate for a time period sufficient to abrade at least a portion of the surface.

DETAILED DESCRIPTION OF THE INVENTION

The present invention provides a CMP composition useful for polishing a substrate (e.g., a semiconductor substrate). The CMP compositions contain colloidal silica as an abrasive, at least one onium compound, and an aqueous carrier, such as water. The onium compound can be a phosphonium salt, a sulfonium salt, or a combination thereof. The CMP compositions of the invention provide for even, rapid removal of silicon dioxide relative to conventional CMP compositions. CMP compositions of the invention including phosphonium salts in the presence of colloidal silica give much higher removal rates than conventional fumed silica slurries at similar solids concentrations and a pH near 11, such as SS25, a standard fumed silica-based CMP slurry. In addition, the phosphonium salt/colloidal silica-based compositions of the invention exhibit significantly higher BPSG removal rates, improved thermal and colloidal stability, and superior planarization efficiency compared to conventional colloidal silica slurries containing ammonium salts. These advantages are particularly evident at low onium concentrations, which can provide a significant economic benefit over the conventional compositions.

In preferred embodiments, the colloidal silica is present in the composition in an amount in the range of about 0.05 to about 35 percent by weight. In other preferred embodiments the colloidal silica is present in the CMP composition in an amount in the range of about 0.1 to about 10 percent by weight, preferably about 1 to about 6 percent by weight. The colloidal silica particles preferably have a mean particle size in the range of about 1 nm to about 200 nm, more preferably about 2 nm to about 100 nm, as determined by laser light scattering techniques, which are well known in the art.

The colloidal silica desirably is suspended in the CMP composition, more specifically in the aqueous carrier component of the CMP composition. When the colloidal silica is suspended in the CMP composition, it is preferably colloidally stable. The term "colloid" refers to the suspension of abrasive particles in the liquid carrier. "Colloidal stability" refers to the maintenance of that suspension over time. In the context of this invention, an abrasive is considered colloidally stable if, when the abrasive is placed into a 100 ml graduated cylinder and allowed to stand without agitation for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., ([B]−[T])/[C]≤0.5). The value of ([B]−[T])/[C] desirably is less than or equal to 0.3, and preferably is less than or equal to 0.1.

Preferred phosphonium salts useful in the compositions and methods of the present invention have the following formula:

wherein each $R^1$, $R^2$, $R^3$ and $R^4$ independently is a substituted or unsubstituted hydrocarbon radical selected from the group consisting of linear $C_1$-$C_{16}$ alkyl, branched $C_3$-$C_{16}$ alkyl, $C_6$-$C_{10}$ aryl, linear $C_1$-$C_{16}$ alkyl-substituted $C_6$-$C_{10}$ aryl, and branched $C_3$-$C_{16}$ alkyl-substituted $C_6$-$C_{10}$ aryl, wherein the hydrocarbon radical optionally can be substituted with one or more functional substituent selected from the group consisting of a hydroxyl substituent, a halo substituent, an ether substituent, an ester substituent, a carboxy substituent, and an amino substituent. Alternatively, $R^1$ and $R^2$ together can form a saturated, unsaturated, or aromatic heterocyclic ring with the phosphorus, P. When the heterocyclic ring is aromatic, $R^4$ is absent.

X— is the conjugate base of an inorganic acid or an organic acid. Non-limiting examples of conjugate bases of inorganic acids include, hydroxyl, a halide (e.g., fluoride, chloride, bromide, and iodide), sulfate, hydrogensulfate, nitrate, phosphate, dihydrogenphosphate, hydrogenphosphate, sulfamate, perchlorate, and the like. Non-limiting examples of conjugate bases of organic acids include, carboxylates (e.g., formate, acetate, propionate, benzoate, glycinate, lactate, citrate, tartrate, and trifluoroacetate), organosulfonates (methanesulfonate, trifluoromethanesulfonate, benzenesulfonate, and toluenesulfonate), organophosphonates (e.g., methylphosphonate, benzenephosphonate, and toluenephosphonate), organophosphates (e.g., ethylphosphate), and the like.

Non-limiting examples of phosphonium salts suitable for use in the compositions and methods of the present invention include tetraphenylphosphonium bromide ($Ph_4PBr$), methyltriphenylphosphonium bromide ($MePh_3Br$), ethyltriphenylphosphonium bromide ($EtPh_3PBr$), butyltriphenylphosphonium bromide ($BuPh_3Br$), hexyltriphenylphosphonium bromide ($HexPh_3PBr$), benzyltriphenylphosphonium bromide ($BzPh_3PBr$), tetrabutylphosphonium bromide ($Bu_4PBr$), tetraphenylphosphonium chloride ($Ph_4PCl$), and tetrabutylphosphonium hydroxide ($Bu_4POH$), and the like.

Optionally, a sulfonium salt can be used in place of or in combination with the phosphonium salt. Non-limiting examples of useful sulfonium salts have the following formula:

wherein each $R^5$, $R^6$ and $R^7$ independently is a substituted or unsubstituted hydrocarbon radical selected from the group consisting of linear $C_1$-$C_{16}$ alkyl, branched $C_3$-$C_{16}$ alkyl, $C_6$-$C_{10}$ aryl, linear $C_1$-$C_{16}$ alkyl-substituted $C_6$-$C_{10}$ aryl, and branched $C_3$-$C_{16}$ alkyl-substituted $C_6$-$C_{10}$ aryl, wherein the hydrocarbon radical optionally can be substituted with one or more functional substituent selected from the group consisting of a hydroxyl substituent, a halo substituent, an ether substituent, an ester substituent, a carboxy substituent, and an amino substituent; and X— is as defined above for the phosphonium compounds. Alternatively, $R^5$ and $R^6$ together can form a saturated, unsaturated, or aromatic heterocyclic ring with the phosphorus, P. When the heterocyclic ring is aromatic, $R^7$ is absent.

Non-limiting examples of sulfonium salts suitable for use in the compositions and methods of the present invention include trimethylsulfonium bromide, methyldiphenylsulfonium bromide, triphenylsulfonium bromide, dibutyl-2,3-dihydroxypropylsulfonium lactate, bis-(2-hydroxyethyl)-2,3-dihydroxypropylsulfonium lactate, and the like.

The CMP compositions of the invention can include one or more onium compound, i.e., one or more phosphonium compound, one or more sulfonium compound, or a combination of one or more phosphonium compound with one or more sulfonium compound. In some preferred embodiments an onium compound is present in the composition at a concentration in the range of about 0.04 to about 200 μmol per gram of composition. In other preferred embodiments, the onium compound is present at a concentration of about 0.4 to about 20 μmol/g, preferably about 1 to about 10 μmol/g.

The CMP compositions of the invention optionally can include one or more oxidizing agent (e.g., to oxidize a component of the semiconductor surface, such as a metal component). Oxidizing agents suitable for use in the CMP compositions and methods of the present invention include, without limitation hydrogen peroxide, persulfate salts (e.g., ammonium monopersulfate, ammonium dipersulfate, potassium monopersulfate, and potassium dipersulfate), periodate salts (e.g., potassium periodate), high oxidation state metal salts such as cerium (IV) or iron (III) salts, and a combination of two or more of the foregoing. Preferably, the oxidizing agent is present in the composition in an amount sufficient to oxidize one or more selected metallic or semiconductor material present in the semiconductor wafer, as is well known in the semiconductor CMP art.

The CMP compositions of the invention can also optionally include suitable amounts of one or more other additive materials commonly included in CMP compositions, such as corrosion inhibitors, viscosity modifying agents, biocides, and the like.

In some embodiments, the CMP compositions further comprise a biocidal amount of a biocide (e.g., an isothiazolinone composition such as KATHON® biocide, available from Rohm and Haas).

The aqueous carrier can be any aqueous solvent, e.g., water, aqueous methanol, aqueous ethanol, a combination thereof, and the like. Preferably, the aqueous carrier is deionized water.

The CMP compositions of the invention have a pH of about 5 or less, preferably about 2 to about 5. The CMP compositions can optionally comprise one or more pH buffering materials, for example, an acid such as hydrochloric acid, acetic acid, and the like, a base such as ammonia, sodium hydroxide, cesium hydroxide, and the like, or a combination thereof, in addition to the other acidic and basic components of the composition (e.g., the organic amino compound and the acidic metal complexing agent).

The CMP compositions of the invention can be prepared by any suitable technique, many of which are known to those skilled in the art. The CMP composition can be prepared in a batch or continuous process. Generally, the CMP composition can be prepared by combining the components thereof in any order. The term "component" as used herein includes individual ingredients (e.g., abrasives, onium compound, acids, bases, oxidizing agents, and the like), as well as any combination of ingredients. For example, an abrasive can be dispersed in water, and the onium compound can be added, and mixed by any method that is capable of incorporating the components into the CMP composition. The pH can be adjusted at any suitable time.

The CMP compositions of the present invention also can be provided as a concentrate, which is intended to be diluted with an appropriate amount of aqueous solvent (e.g., water) prior to use. In such an embodiment, the CMP composition concentrate can include the various components dispersed or dissolved in an aqueous solvent in amounts such that, upon dilution of the concentrate with an appropriate amount of aqueous solvent, each component of the polishing composition will be present in the CMP composition in an amount within the appropriate range for use.

The invention also provides a method of chemically-mechanically polishing a substrate. The method comprises abrading a surface of a substrate with a CMP composition of the invention. Preferably, the substrate is a semiconductor substrate comprising silicon dioxide.

A preferred method comprises (i) contacting a surface of a substrate with a polishing pad and a CMP composition of the invention as described herein, and (ii) moving the polishing pad relative to the surface of the substrate with the polishing composition therebetween, thereby abrading at least a portion of the surface to polish the substrate.

The CMP methods of the present invention can be used to polish any suitable substrate, and is especially useful for polishing substrates comprising silicon dioxide. The silicon dioxide can be I any form. Non-limiting examples of silicon dioxide commonly utilized in semiconductor materials include thermal silicon dioxide, boro-phosphorus silicate glass (BPSG), phosphorous silicate glass (PSG), undoped silicate glass (USG), high density plasma oxide, plasma-enhanced tetraethylorthosilicate (PETEOS), and the like.

A particular advantage of the compositions and methods of the present invention is that silicon dioxide removal rates are greatly enhanced by the presence of the onium compound, with out need for increasing the abrasive concentration.

The CMP methods of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a CMP composition of the invention and then moving the polishing pad relative to the substrate, so as to abrade at least a portion of the substrate to polish the substrate.

A substrate can be planarized or polished with a CMP composition of the invention using any suitable polishing pad (e.g., polishing surface). Suitable polishing pads include, for example, woven and non-woven polishing pads, grooved or non-grooved pads, porous or non-porous pads, and the like. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example illustrates the effectiveness of CMP compositions according to the present invention for polishing silicon dioxide surfaces.

CMP compositions of the invention were prepared containing about 6 percent by weight of a colloidal silica having a mean particle size in the range of about 30 nm, about 3.85 $\mu$mol/g of a phosphonium compound, in water at a pH of about 4. The following phosphonium compounds were used: tetraphenylphosphonium bromide ($Ph_4PBr$), methyltriphenylphosphonium bromide ($MePh_3Br$), ethyltriphenylphosphonium bromide ($EtPh_3PBr$), butyltriphenylphosphonium bromide ($BuPh_3Br$), hexyltriphenylphosphonium bromide ($HexPh_3PBr$), benzyltriphenylphosphonium bromide ($BzPh_3PBr$), tetrabutylphosphonium bromide ($Bu_4PBr$), tetraphenylphosphonium chloride ($Ph_4PCl$), and tetrabutylphosphonium hydroxide ($Bu_4POH$). For comparison purposes, a formulation was also prepared containing tetrabutylammonium hydroxide in place of the phosphonium compound. In addition, control compositions including only 6 percent colloidal silica and only 12 percent fumed silica, and no onium compound, were also prepared.

Figure 1:
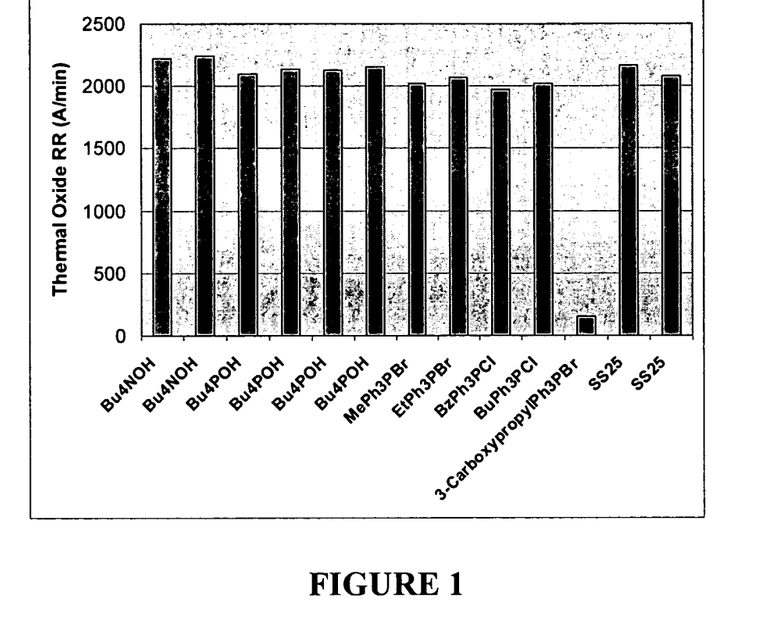
FIG. 1 shows silicon dioxide removal rates obtained from polishing of blanket wafers using various CMP compositions of the invention.
Figure 2:
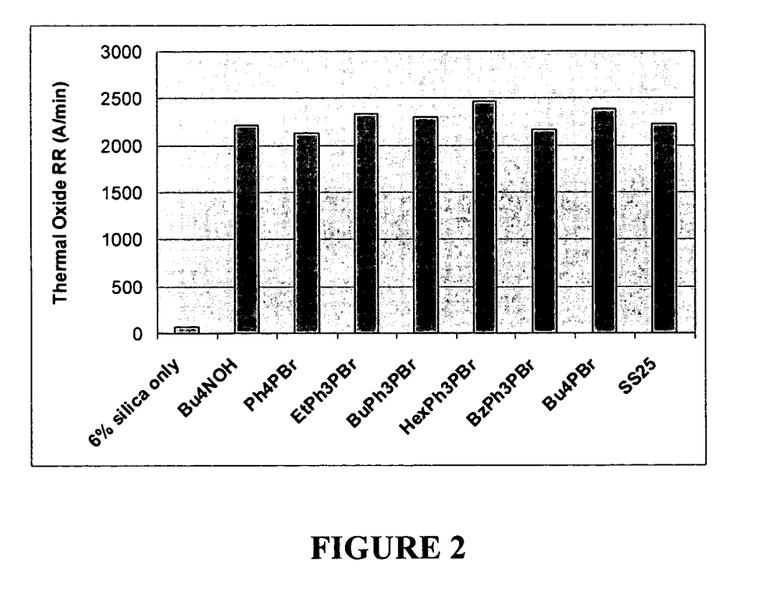
FIG. 2 shows silicon dioxide removal rates obtained from polishing of blanket wafers using various CMP compositions of the invention.

The compositions were evaluated by polishing thermal oxide and BPSG blanket wafers. The wafers were polished on a Logitech CMP polisher using an IC-1000 pad, a down force of about 3.6 pounds per square inch (psi), a platen speed of about 60 revolutions per minute (rpm), a carrier speed of about 56 rpm, and a slurry feed rate of about 150 milliliters per minute (mL/min). Results of thermal oxide evaluations are shown in FIG. 1 and FIG. 2, and are reported as silicon dioxide removal rate in Angstroms per minute (Å/min). Thermal oxide removal rates as high as 2400 Å/min were obtained. The highest thermal oxide removal rate was obtained with heyltriphenylphosphonium bromide (2462 Å/min). BPSG removal rates as high as 5596 Å/min were obtained in polishing BPSG wafers with the same compositions. A control composition containing only 6 percent colloidal silica had a thermal oxide removal rate of about 70 Å/min, while a control composition containing about 12 percent fumed silica at pH 11 (no onium compound present) had a removal rate of about 2200 Å/min.

EXAMPLE 2

This example compares the effects of phosphonium compound versus ammonium compound on silicon dioxide removal rates, planarization efficiency and storage stability.

Compositions of the invention comprising a phosphonium compound, tetrabutylphosphonium bromide were evaluated for effects on polishing BPSG blanket wafers at phosphonium concentrations in the range of about 2 to about 8 $\mu$mol/g, with about 6 percent colloidal silica (30 nm mean particle size) in deionized water at a pH of about 4. The wafers were polished under the conditions listed in Example 1. Comparison was made to a composition containing tetrabutylammonium hydroxide (TBAH) in place of the phosphonium salt. The results are shown in FIG. 3.

Figure 3:
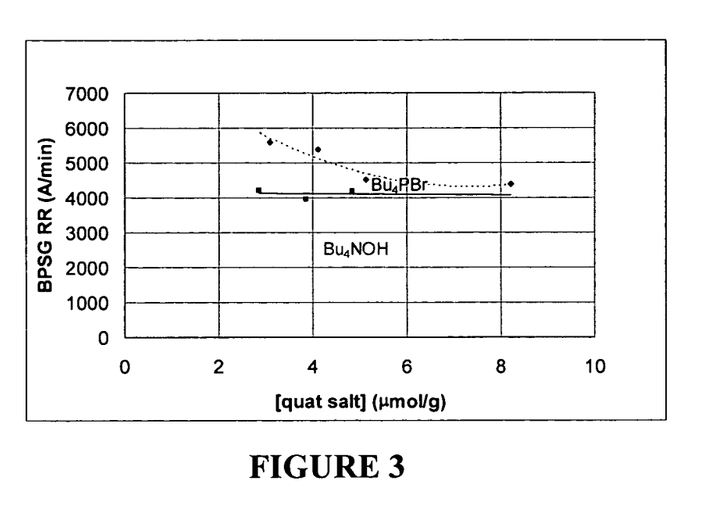
FIG. 3 illustrates the effect of onium compound concentration on the silicon dioxide removal rate compared to a composition including an ammonium salt.

As is evident from the data in FIG. 3, BPSG removal rates were surprisingly higher and varied more with phosphonium concentration than removal rates obtained with ammonium-containing compositions. Thus, the BPSG removal rates for compositions of the invention can be tailored to a desired level by varying the onium salt concentration, unlike conventional compositions containing ammonium salts.

Figure 4:
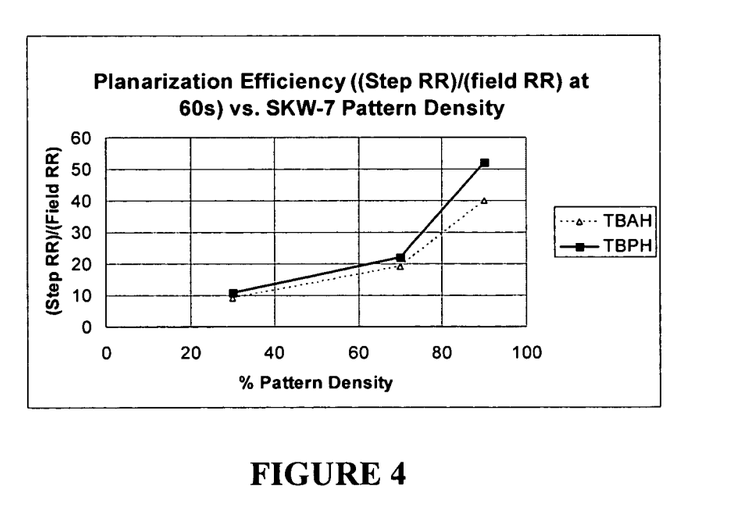
FIG. 4 illustrates the effect of onium compound on storage stability as determined by decrease in thermal oxide removal rate after storage at about 43.3° C. (110° F.) for 5 days for compositions of the invention compared to conventional compositions including an ammonium salt.

In addition, the storage stability of CMP compositions of the invention was evaluated at varying phosphonium salt concentration compared to compositions including an ammonium salt (TBAH) in place of a phosphonium salt (tetrabutylphosphonium hydroxide, TBPH). FIG. 4 illustrates the effect of phosphonium salt on storage stability as determined by decrease in thermal oxide removal rate after storage of the compositions at about 43.3° C. (110° F.) for 5 days. The ratio of the removal rate after 5 days storage to the initial removal rate (before storage) is plotted against the salt concentration. The results in FIG. 4 show that the CMP compositions of the invention were surprisingly stable over the entire concentration range evaluated (retaining about 90 percent of their thermal oxide removal rate), while the compositions containing ammonium salts showed unacceptably high variability.

Figure 5:
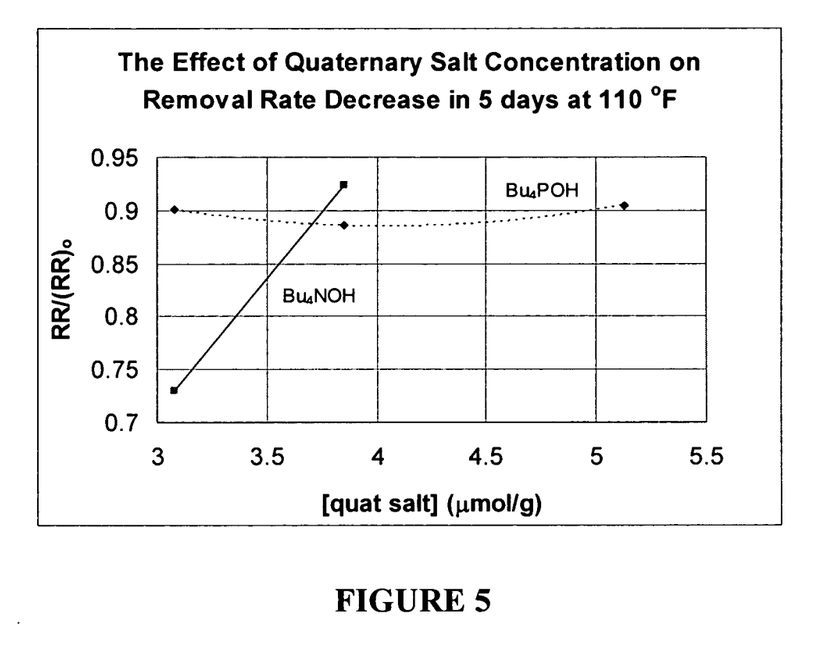
FIG. 5 illustrates the effect of onium compound on efficiency of patterned wafer planarization for compositions of the invention compared to conventional compositions including an ammonium salt.

SKW-7 pattern wafers were also planarized with the compositions of the invention containing TBPH and conventional compositions containing TBAH. FIG. 5 shows the efficiency for pattern planarization compared to compositions including an ammonium salt. The ratio of the step removal rate to the field removal rate is plotted against SKW-7 pattern density. The results in FIG. 5 show that the compositions of the invention containing TBPH exhibited a greater pattern planarization efficiency versus the conventional ammonium compositions.

EXAMPLE 3

This example illustrates the effect of varying pH, onium concentration, and colloidal silica concentration (solids) level on PETEOS removal rates.

Compositions comprising about 600 to about 1200 ppm (2.2 to 4.4 μmol/g) of tetrabutylphosphonium hydroxide (TBPH) and about 3 to about 6 percent by weight colloidal silica at pH 4 were utilized to polish PETEOS blanket wafers under conditions substantially similar to the polishing conditions used in Examples 1 and 2. The PETEOS removal rates are plotted against TBPH concentration and silica solids level in a surface plot in FIG. 6.

Compositions comprising about 600 to about 1200 ppm (2.2 to 4.4 μmol/g) of tetrabutylphosphonium hydroxide (TBPH) and about 4.5 percent by weight colloidal silica at pH values on the range of about 3.5 to about 4.5 were also utilized to polish PETEOS blanket wafers under conditions substantially similar to the polishing conditions used in Examples 1 and 2. The PETEOS removal rates are plotted against TBPH concentration and pH in a surface plot in FIG. 7.

Figure 6:
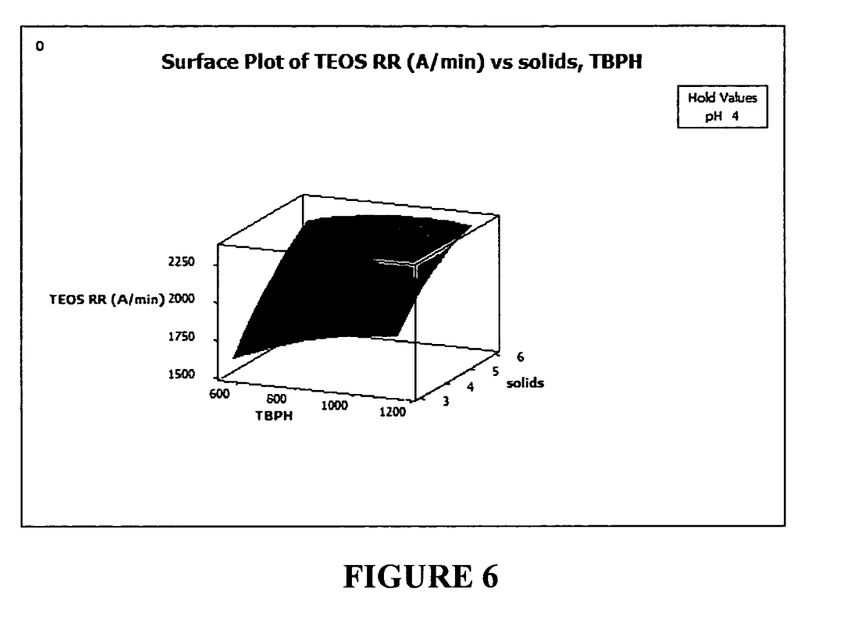
FIG. 6 shows a surface plot of PETEOS (TEOS) removal rate versus tetrabutylphosphonium hydroxide (TBPH) concentration and silica solids level at a constant pH.
Figure 7:
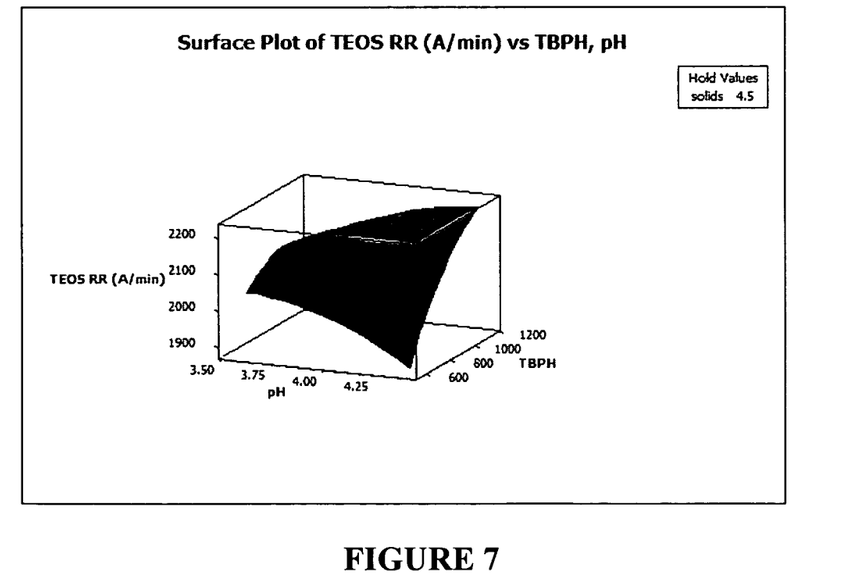
FIG. 7 shows a surface plot of PETEOS (TEOS) removal rate versus tetrabutylphosphonium hydroxide (TBPH) concentration and pH at a constant silica solids level.

The surface plots in FIGS. 6 and 7 show that PETEOS removal rates can be varied, as desired, by appropriate choice of pH, silica solids level, and onium concentration.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A chemical-mechanical polishing (CMP) composition consisting essentially of:
    (a) colloidal silica;
    (b) at least one onium compound selected from the group consisting of a phosphonium salt, a sulfonium salt, and a combination thereof, wherein the phosphomium salt is selected from the group consisting of tetraphenylphosphonium bromide, methyltriphenylphosphonium bromide, ethyltriphenylphosphonium bromide, butyltriphenylphosphonium bromide, hexyltriphenylphosphonium bromide, benzyltriphenylphosphonium bromide, tetrabutylphosphonium bromide, tetraphenylphosphonium chloride, and tetrabutylphosphonium hydroxide; and the sulfonium salt is selected from a group consisting of trimethylsulfonium bromide, methyldiphenylsulfonium bromide, triphenylsulfonium bromide, dibutyl-2,3-dihydroxypropylsulfonium lactate, and bis-(2-hydroxyethyl)-2,3-dihydroxypropylsulfonium lactate;

(c) an aqueous carrier therefore; the composition having a pH of about 5 or less; wherein the colloidal silica is present in the composition in an amount in the range of about 0.05 to about 35 percent by weight and at least one onium salt is present in the composition in an amount in the range of about 0.04 to about 200 micromoles per gram of composition.

2. The CMP composition of claim 1 wherein the pH is in the range of about 2 to about 5.

3. A chemical-mechanical polishing (CMP) composition comprising:
   (a) about 0.1 to about 10 percent by weight of colloidal silica;
   (b) about 0.4 to about 20 micromoles per gram of at least one phosphonium salt, wherein the at least one phosphonium salt is selected from the group consisting of tetraphenylphosphonium bromide, methyltriphenylphosphonium bromide, ethyltriphenylphosphonium bromide, butyltriphenylphosphonium bromide, hexyltriphenylphosphonium bromide, benzyltriphenylphosphonium bromide, tetrabutylphosphonium bromide, tetraphenylphosphonium chloride, and tetrabutylphosphonium hydroxide;

(c) an aqueous carrier therefor;
   the composition having a pH of about 5 or less.

4. The CMP composition of claim 3 wherein the colloidal silica is present in the composition in an amount in the range of about 1 to about 6 percent by weight.

5. The CMP composition of claim 3 wherein at least one phosphonium salt is present in the composition in an amount in the range of about 1 to about 10 micromoles per gram of composition.

6. The CMP composition of claim 3 wherein the pH is in the range of about 2 to about 5.

7. A chemical-mechanical polishing (CMP) method for polishing a substrate, the method comprising abrading a surface of the substrate with a CMP composition of claim 1.

8. The CMP method of claim 7 wherein the at least one onium compound comprises at least one phosphonium salt.

9. A chemical-mechanical polishing (CMP) method for polishing a substrate, the method comprising abrading a surface of the substrate with a CMP composition of claim 3.

10. A chemical-mechanical polishing (CMP) method for polishing a semiconductor substrate, the method comprising the steps of:
   (a) contacting a surface of a semiconductor substrate with a polishing pad and an aqueous CMP composition according to claim 1; and
   (b) causing relative motion between the polishing pad and the substrate while maintaining a portion of the CMP composition in contact with the surface between the pad and the substrate for a time period sufficient to abrade at least a portion of the semiconductor surface.

11. The CMP method of claim 10 wherein the colloidal silica is present in the composition in an amount in the range of about 0.05 to about 35 percent by weight.

12. The CMP method of claim 10 wherein at least one phosphonium salt is present in the composition in an amount in the range of about 0.04 to about 200 micromoles per gram of composition.

13. The CMP method of claim 10 wherein the pH of the CMP composition is in the range of about 2 to about 5.

14. The CMP method of claim 10 wherein the substrate comprises silicon dioxide.

\* \* \* \* \*